(12) United States Patent
Takizawa

(10) Patent No.: US 11,855,036 B2
(45) Date of Patent: Dec. 26, 2023

(54) BONDING APPARATUS AND BONDING METHOD

(71) Applicant: Kioxia Corporation, Tokyo (JP)

(72) Inventor: Masaharu Takizawa, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 336 days.

(21) Appl. No.: 17/117,672

(22) Filed: Dec. 10, 2020

(65) Prior Publication Data

US 2021/0272924 A1    Sep. 2, 2021

(30) Foreign Application Priority Data

Feb. 27, 2020 (JP) .................................. 2020-031865

(51) Int. Cl.
*H01L 21/20*    (2006.01)
*H01L 23/00*    (2006.01)

(52) U.S. Cl.
CPC ........ *H01L 24/743* (2013.01); *H01L 21/2007* (2013.01); *H01L 24/75* (2013.01)

(58) Field of Classification Search
CPC ... H01L 24/743; H01L 21/2007; H01L 24/75; H01L 21/683; H01L 21/6831; H01L 21/6833; H01L 21/6838; H01L 21/187; H01L 21/687; H01L 21/68714; H01L 21/68735; H01L 21/68785
See application file for complete search history.

(56) References Cited

U.S. PATENT DOCUMENTS

| | | | | |
|---|---|---|---|---|
| 7,311,810 B2* | 12/2007 | Mok | .................... | H01L 21/6723 |
| | | | | 204/242 |
| 7,372,691 B2 | 5/2008 | Chiang et al. | | |
| 8,186,077 B2* | 5/2012 | Kawaji | ............... | H01L 21/6875 |
| | | | | 34/304 |
| 9,165,802 B2 | 10/2015 | Young et al. | | |

(Continued)

FOREIGN PATENT DOCUMENTS

| CN | 1707323 A | 12/2005 |
|---|---|---|
| CN | 110828325 A | 2/2020 |

(Continued)

OTHER PUBLICATIONS

U.S. Appl. No. 17/009,998, filed Sep. 2, 2020, Hideo, ETO.

*Primary Examiner* — Eduardo A Rodela
(74) *Attorney, Agent, or Firm* — Oblon, McClelland, Maier & Neustadt, L.L.P.

(57) ABSTRACT

A bonding apparatus according to the present embodiment includes a first holder and a second holder. The first holder holds a first substrate. The second holder includes a plurality of suction portions that suck a second substrate and that are arranged on concentric circles about a center of the second substrate substantially evenly. The second holder bonds the second substrate to the first substrate while opposing the second substrate to the first substrate. A first gas supply portion has a plurality of first gas supply ports to supply gas toward a bonding position between the first substrate and the second substrate. The first gas supply ports are provided to correspond to at least a part of outermost suction portions that are farthest ones of the suction portions from a center of the second holder, and are concentrically arranged on a circle about the center substantially evenly.

20 Claims, 13 Drawing Sheets

(56) References Cited

U.S. PATENT DOCUMENTS

| | | | |
|---|---|---|---|
| 9,296,193 B2 | 3/2016 | Burggraf et al. | |
| 9,539,800 B2* | 1/2017 | Kito | H01L 21/2007 |
| 9,922,851 B2 | 3/2018 | Lin et al. | |
| 10,438,918 B2 | 10/2019 | Omori et al. | |
| 10,847,495 B2* | 11/2020 | Nagata | H01L 21/67092 |
| 10,906,283 B2 | 2/2021 | Kim et al. | |
| 2005/0275999 A1 | 12/2005 | Chiang et al. | |
| 2019/0228995 A1* | 7/2019 | Wimplinger | H01L 21/187 |
| 2019/0385973 A1* | 12/2019 | Otsuka | H01L 24/75 |
| 2020/0055296 A1 | 2/2020 | Kim et al. | |
| 2021/0057373 A1* | 2/2021 | Kim | H01L 24/16 |
| 2021/0104405 A1* | 4/2021 | Kim | B32B 37/10 |
| 2021/0143026 A1* | 5/2021 | Jeon | B32B 37/0046 |
| 2021/0287926 A1 | 9/2021 | Eto | |

FOREIGN PATENT DOCUMENTS

| | | |
|---|---|---|
| JP | 7-66093 | 3/1995 |
| JP | 2007-194343 A | 8/2007 |
| JP | 2007-194347 A | 8/2007 |
| JP | 4821091 B2 | 11/2011 |
| JP | 5476657 B2 | 4/2014 |
| JP | 5979135 B2 | 8/2016 |
| JP | 2017-168473 A | 9/2017 |
| JP | 2017-168474 A | 9/2017 |
| JP | 2018-26413 A | 2/2018 |
| JP | 2018-26414 A | 2/2018 |
| JP | 2019-129165 | 8/2019 |
| JP | 2019-186314 A | 10/2019 |
| JP | 2021-145109 A | 9/2021 |
| TW | M504009 U | 7/2015 |
| TW | 201828328 A | 8/2018 |
| TW | 201944866 A | 11/2019 |

\* cited by examiner

BONDING APPARATUS AND BONDING METHOD

CROSS REFERENCE TO RELATED APPLICATIONS

This application is based upon and claims the benefit of priority from the prior Japanese Patent Application No. 2020-031865, filed on Feb. 27, 2020, the entire contents of which are incorporated herein by reference.

FIELD

The embodiments of the present invention relate to a bonding apparatus and a bonding method.

BACKGROUND

There is known an apparatus of bonding semiconductor substrates to each other by intermolecular forces. This bonding apparatus holds an upper substrate and pushes down the center of the upper substrate by a striker to bring it into contact with the center of a lower substrate. Thereafter, the upper substrate is bonded to the lower substrate from its center to its outer circumferential portion, so that a bonded area is expanded. Accordingly, the upper substrate and the lower substrate are entirely bonded to each other finally.

However, when an outer edge portion of the upper substrate is bonded to the lower substrate, gas between the outer edge portion of the upper substrate and an outer edge portion of the lower substrate makes an abrupt transition from a high-pressure state to a low-pressure state and makes adiabatic expansion. When moisture contained in the gas is condensed because of adiabatic expansion of the gas, voids may be generated between the outer edge portion of the upper substrate and the outer edge portion of the lower substrate. These voids cause poor bonding, leading to reduced reliability.

BRIEF DESCRIPTION OF THE DRAWINGS

FIGS. 7A and 7B are cross-sectional views illustrating an example of configurations and functions of the pipes and the like;

DETAILED DESCRIPTION

Figure 1:
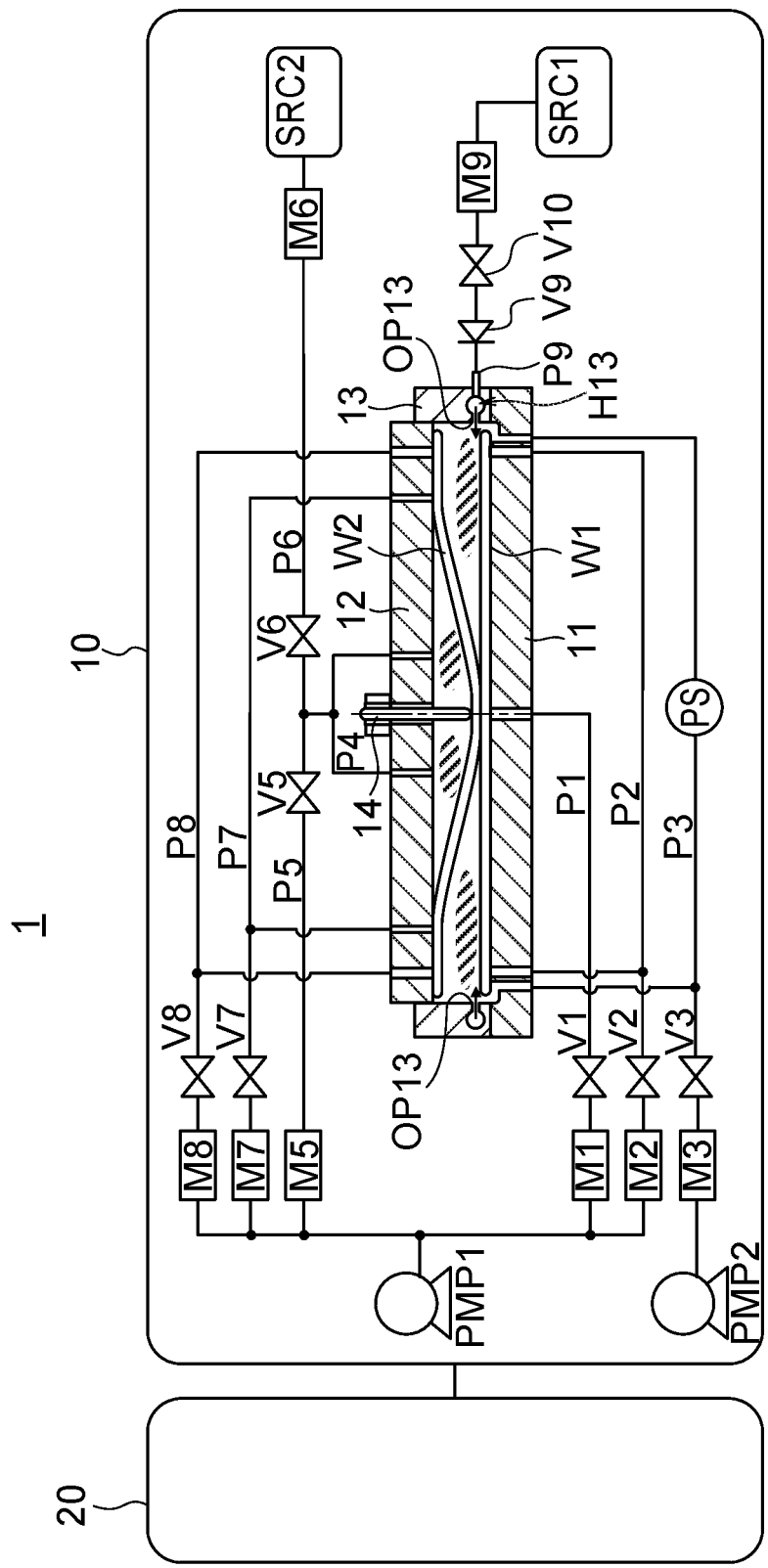
FIG. 1 is a cross-sectional view illustrating a configuration example of a bonding apparatus according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A bonding apparatus according to the present embodiment includes a first holder and a second holder. The first holder holds a first substrate. The second holder includes a plurality of suction portions that suck a second substrate and that are arranged on concentric circles about a center of the second substrate substantially evenly. The second holder bonds the second substrate to the first substrate while opposing the second substrate to the first substrate. A first gas supply portion has a plurality of first gas supply ports to supply gas toward a bonding position between the first substrate and the second substrate. The first gas supply ports are provided to correspond to at least a part of outermost suction portions that are farthest ones of the suction portions from a center of the second holder, and are concentrically arranged on a circle about the center of the second holder substantially evenly.

First Embodiment

FIG. 1 is a cross-sectional view illustrating a configuration example of a bonding apparatus according to a first embodiment. A bonding apparatus 1 bonds a semiconductor wafer W1 and a semiconductor wafer W2 to each other into a single body of semiconductor wafer. The bonding apparatus 1 is used for generating an SOI (Silicon On Insulator) substrate or joining wires on the semiconductor wafers W1 and W2 to each other, for example.

The bonding apparatus 1 includes a main body 10 and a control device 20. The main body 10 includes holders 11 and 12 and a gas supply portion 13. The holder 11 can hold the semiconductor wafer W1 by a vacuum chuck or an electromagnetic chuck. The holder 12 can hold the semiconductor wafer W2 by a vacuum chuck or an electromagnetic chuck. The gas supply portion 13 is configured to supply gas to between the holders 11 and 12. In the following descriptions, it is assumed that the holders 11 and 12 respectively suck the semiconductor wafers W1 and W2 by vacuum chucks in the present embodiment. However, the holders 11 and 12 may suck the semiconductor wafers W1 and W2 by using electromagnetic chucks. The holder 12 bonds the semiconductor wafer W2 to the semiconductor wafer W1 on the holder 11 while opposing the semiconductor wafer W2 to the semiconductor W1. The configurations and operations of the holders 11 and 12 and the gas supply portion 13 will be described later in more detail.

The control device 20 is, for example, a computer that controls respective constituents of the main body 10.

Pipes P1 to P3 are connected to the holder 11. Openings of the pipes P1 to P3 communicate with a mounting surface of the holder 11 that sucks the semiconductor wafer W1. The opening of the pipe P1 is provided at the center of the mounting surface of the holder 11. The openings of the pipes P2 are provided in portions of the mounting surface of the holder 11 which correspond to an end portion of the semiconductor wafer W1. The openings of the pipes P3 are provided in portions of the mounting surface which correspond to an outer edge of the semiconductor wafer W1 and to the outer side of the outer edge of the semiconductor wafer W1. Therefore, the openings of the pipes P1 to P3 are arranged to be distant from the center of the mounting surface of the holder 11 toward the outer edge portion in this order. The number of the pipes P1 to P3 or the number of openings provided in the mounting surface of the holder 11 is not specifically limited.

The pipes P1 and P2 are connected to a vacuum pump PMP1 via gate valves V1 and V2 and pressure/flow-rate adjusters M1 and M2, respectively. The vacuum pump PMP1 exhausts gas from the mounting surface of the holder 11 through the pipes P1 and P2, causing the semiconductor wafer W1 to be sucked onto the mounting surface of the holder 11 by vacuum suction. That is, the vacuum pump PMP1 is a pump for a vacuum chuck. The gate valves V1 and V2 can open and close the pipes P1 and P2, and adjust their ratios of valve opening (opening areas), respectively. The pressure/flow-rate adjusters M1 and M2 each control the ratio of valve opening of the corresponding gate valve V1 or V2 based on the air pressure in the corresponding pipe P1 or P2 and/or the flow rate of gas from the corresponding pipe P1 or P2. Accordingly, the semiconductor wafer W1 is sucked onto the mounting surface of the holder 11 with an appropriate pressure.

The pipe P3 is connected to a vacuum pump PMP2 via a pressure gauge PS, a gate valve V3, and a pressure/flow-rate adjuster M3. The vacuum pump PMP2 exhausts gas in a space surrounded by the holders 11 and 12 and the gas supply portion 13 through the pipe P3. That is, the vacuum pump PMP2 is an exhaust pump. This space is also referred to as a chamber below. The pressure gauge PS measures the air pressure in the chamber. The gate valve V3 can open and close the pipe P3, and adjusts its ratio of valve opening (an opening area). The pressure/flow-rate adjuster M3 controls the ratio of valve opening of the gate valve V3 based on the air pressure in the chamber or in the pipe P3 and/or the flow rate of gas from the pipe P3. Accordingly, it is possible to adjust the air pressure in the chamber between the holders 11 and 12 and the speed of exhausting gas from the chamber.

Pipes P4 to P8 are connected to the holder 12. Openings of the pipes P4, P7, and P8 communicate with a suction surface (mounting surface) of the holder 12 that sucks the semiconductor wafer W2. The openings of the pipes P4 (0 P4 in FIG. 2) are provided near the center of the suction surface (mounting surface) of the holder 12. The openings of the pipes P7 (OP7 in FIG. 2) are provided at positions closer to the outer edge of the holder 12 than the openings of the pipes P4. Further, the openings of the pipes P8 (OP8 in FIG. 2) are provided at positions closer to the outer edge of the holder 12 than the openings of the pipes P7. Among the pipes P4, P7, and P8, the pipes P8 are provided at the farthest positions from the center of the holder 12 (at the outermost positions). Accordingly, the openings of the pipes P4, P7, and P8 are arranged to be distant from the center of the mounting surface of the holder 12 toward the outer edge portion in this order. The number of the pipes P4, P7, and P8 or the number of openings provided in the mounting surface of the holder 12 is not specifically limited.

The pipe P4 branches into pipes P5 and P6. The pipe P5 is connected to the pipe P4 via a gate valve V5, and is connected to the vacuum pump PMP1 via a pressure/flow-rate adjuster M5. The vacuum pump PMP1 exhausts gas from the mounting surface of the holder 12 through the pipes P4 and P5. The pressure/flow-rate adjuster M5 controls the ratio of valve opening of the gate valve V5 based on the air pressure in the pipes P4 and P5 and/or the flow rate of gas from the pipes P4 and P5. Accordingly, the semiconductor wafer W2 is sucked onto the mounting surface of the holder 12 with an appropriate pressure.

Meanwhile, the pipe P6 is connected to the pipe P4 via a gate valve V6, and is connected to a gas supply source SRC2 via a pressure/flow-rate adjuster M6. The gas supply source SRC2 supplies gas to between the semiconductor wafer W2 and the holder 12 through the pipes P4 and P6. The pressure/flow-rate adjuster M6 controls the ratio of valve opening of the gate valve V6 based on the air pressure in the pipes P4 and P6 and/or the flow rate of gas to the pipes P4 and P6. For example, the pressure/flow-rate adjuster M6 adjusts the air pressure between the semiconductor wafer W2 and the holder 12 to be equal to or higher than the air pressure between the semiconductor wafer W1 and the semiconductor wafer W2. By this adjustment, the semiconductor wafer W2 is smoothly separated from the holder 12. Also, the semiconductor wafers W1 and W2 can be smoothly bonded to each other.

As described above, the pipe P4 is connected to the vacuum pump PMP1 via the pipe P5 to suck gas between the holder 12 and the semiconductor wafer W2. The pipe P4 is also connected to the gas supply source SRC2 that supplies gas to between the holder 12 and the semiconductor wafer W2, via the pipe P6. Accordingly, it is possible to surely suck the semiconductor wafer W2 onto a suction surface of the holder 12 and to smoothly separate the semiconductor wafer W2 from the suction surface of the holder 12.

The pipes P7 and P8 are connected to the vacuum pump PMP1 via gate valves V7 and V8 and pressure/flow-rate adjusters M7 and M8, respectively. The vacuum pump PMP1 exhausts gas from the mounting surface of the holder 12 through the pipes P7 and P8, causing the semiconductor wafer W2 to be sucked onto the mounting surface of the holder 12 by vacuum suction. The gate valves V7 and V8 can open and close the pipes P7 and P8, and adjust their ratios of valve opening (opening areas). The pressure/flow-rate adjusters M7 and M8 each control the ratio of valve opening of the corresponding gate valve V7 or V8 based on the air pressure in the corresponding pipe P7 or P8 and/or the flow rate of gas from the corresponding pipe P7 or P8. Accordingly, the semiconductor wafer W2 is sucked onto the mounting surface of the holder 12 with an appropriate pressure.

Further, a pipe P9 is connected to the gas supply portion 13. The gas supply portion 13 is a tubular member having a cavity H13 that is hollow and is provided along the outer circumference of the holder 11. The gas supply portion 13 has a plurality of gas supply ports OP13 for supplying gas toward a bonding position between the semiconductor wafers W1 and W2. The gas supply ports OP13 communicate with the cavity H13 in the gas supply portion 13 and are open toward the bonding position between the semiconductor wafers W1 and W2. The opening shape of each gas supply port OP13 may be circular, square, or oval, for example. Further, the gas supply ports OP13 may be slits having major axes in the circumferential direction of the holder 11. Accordingly, it is possible to efficiently supply gas to the position of joining of the semiconductor wafers W1 and W2. An opening of the pipe P9 communicates with the cavity H13 of the gas supply portion 13 and is provided for introducing gas into the cavity H13. The pipe P9 is connected to a gas supply source SRC1 via a check valve V9, a gate valve V10, and a pressure/flow-rate adjuster M9.

The gas supply source SRC1 introduces gas into the gas supply portion 13 through the pipe P9. The check valve V9 prevents gas from flowing back from the gas supply portion 13 to the gas supply source SRC1. The gate valve V10 can open and close the pipe P9, and adjusts the ratio of valve opening (an opening area). The pressure/flow-rate adjuster M9 controls the ratio of valve opening of the gate valve V10 based on the air pressure in the pipe P9 and/or the flow rate of gas to the pipe P9. Accordingly, the gas supply portion 13 can supply gas at a predetermined flow rate with an appropriate pressure to the bonding position between the semiconductor wafers W1 and W2.

Figure 2:
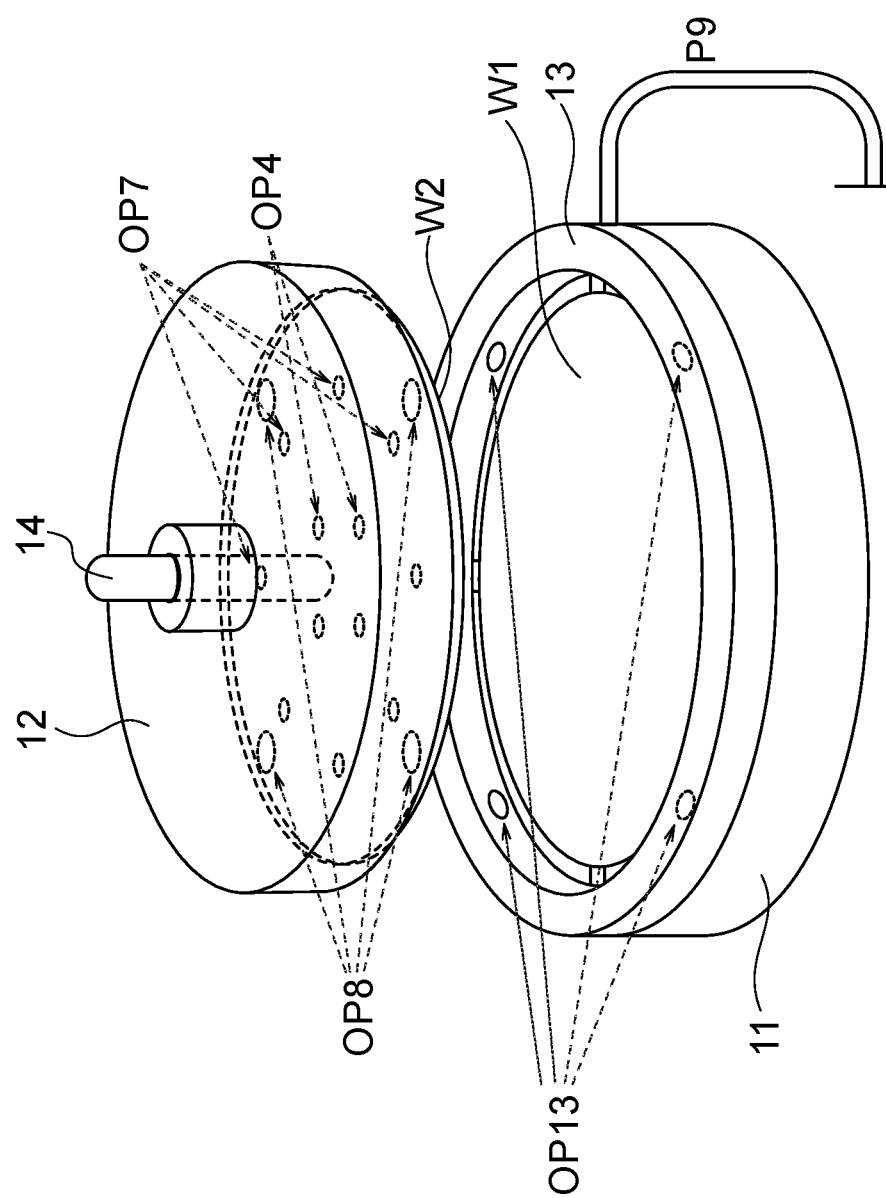
FIG. 2 is a perspective view illustrating a configuration example of the holders and the gas supply portion.

FIG. 2 is a perspective view illustrating a configuration example of the holders 11 and 12 and the gas supply portion 13. The holder 11 has a substantially circular mounting surface and sucks the semiconductor wafer W1 to hold the semiconductor wafer W1 on the mounting surface thereof. The gas supply portion 13 is connected to the pipe P9 and introduces gas from the gas supply source SRC1 in FIG. 1 into the cavity H13. The gas supply portion 13 is provided to be substantially annular along the outer edge of the holder 11 and has the gas supply ports OP13 that communicate between its inner wall surface and the cavity H13. The gas supply ports OP13 supply gas toward a bonding position between the semiconductor wafers W1 and W2. Gas is inert gas, for example, helium, nitrogen, or argon.

The holder 12 has a substantially circular mounting surface and sucks the semiconductor wafer W2 to hold the semiconductor wafer W2 on the mounting surface thereof. The holder 12 has the openings OP4, OP7, and OP8 in the mounting surface as suction portions that suck the semiconductor wafer W2. The openings OP4, OP7, and OP8 communicate with the pipes P4, P7, and P8 in FIG. 1, respectively, and are concentrically arranged on concentric circles about the center of the semiconductor wafer W2 and the mounting surface of the holder 12 substantially evenly. Plural openings OP4, OP7, or OP8 are provided on the corresponding one of the concentric circles. The openings OP4 are inner suction portions arranged to be closer to the center than the other openings OP7 and OP8 and suck the semiconductor wafer W2 in an auxiliary manner. The openings OP7 are farther from the center than the openings OP4 and are arranged on the inner side of the openings OP8. The openings OP7 also suck the semiconductor wafer W2 in an auxiliary manner. The openings OP8 are outermost suction portions that are arranged to be farthest from the center with respect to the other openings OP4 and OP7, and suck the semiconductor wafer W2 to the end in a bonding process.

The holder 12 sucks the semiconductor wafer W2, and bonds it to the semiconductor wafer W1 held on the holder 11 while opposing them to each other. At this time, suction (evacuation) is weakened or stopped from a closer opening to the center of the holder 12 to a farther opening, that is, in the order of the openings OP4, OP7, and OP8. When suction by the openings OP4 is weakened or stopped, a pushing portion (a striker) 14 provided at the center of the holder 12 pushes out the center of the semiconductor wafer W2 from the holder 12 toward the semiconductor wafer W1. Accordingly, the center of the semiconductor wafer W2 is pushed out toward the semiconductor wafer W1 as illustrated in FIG. 1, to come into contact with the semiconductor wafer W1. Next, suction by the openings OP7 is weakened or stopped, and the semiconductor wafer W2 is brought into contact with the semiconductor wafer W1 from the center of the semiconductor wafer W2 to radially outer side. Accordingly, bonding of the semiconductor wafer W1 and the semiconductor wafer W2 spreads from the center to the outer edge. Further, suction by the openings OP8 is weakened or stopped finally, and the semiconductor wafer W2 is entirely bonded to the semiconductor wafer W1 from the center to the outer edge. The holders 11 and 12 may be turned upside down. Details of the bonding process will be described later referring to FIGS. 3A to 3F.

The gas supply portion 13 is provided to be substantially annular along the outer edge of the holder 11 and has the gas supply ports OP13 inside thereof. The gas supply ports OP13 are provided at positions corresponding to the openings OP8 that are the outermost openings farthest from the center of the holder 12 among the openings OP4, OP7, and OP8. Therefore, the number of the gas supply ports OP13 is the same as the number of the openings OP8 in the present embodiment. Further, the gas supply ports OP13 are arranged further outside the openings OP4 to OP8. Furthermore, the gas supply ports OP13 are concentrically arranged on a circle about the center of the holder 12 substantially evenly. Accordingly, the gas supply ports OP13 supply gas from outside of the outer edges of the semiconductor wafers W1 and W2 in an opposite direction to a spreading direction in which bonding of the semiconductor wafers W1 and W2 spreads, when the semiconductor wafer W2 is separated from the openings OP8. The spreading direction of bonding is within a substantially parallel plane to a surface of bonding of the semiconductor wafers W1 and W2 and is a direction from the center of the holders 11 and 12 to the outer edges thereof. Because the openings OP8 suck the outer edge portion of the semiconductor wafer W2 to the end, the gas supply portion 13 supplies gas to the bonding surface between the semiconductor wafers W1 and W2 when the outer edge portion of the semiconductor wafer W2 is separated from the openings OP8.

Further, the gas supply portion 13 may also have a function as an edge guide that receives the holder 12 therein and guides the holder 12 to immediately above the holder 11 when the holder 12 is brought closer to the holder 11. The gas supply portion 13 may be fixed to the holder 12 while being integrated with the holder 12, or may be provided on the holder 11 side. The gas supply portion 13 may be detachable from the holders 11 and 12 or may be movable up and down. The size of the gas supply portion 13 is not specifically limited, as long as it does not hinder the process of bonding the semiconductor wafers W1 and W2 to each other and the gas supply ports OP13 can supply gas to the bonding position between the semiconductor wafers W1 and W2. For example, the gas supply portion 13 may be configured in such a manner that the holders 11 and 12 and the gas supply portion 13 have substantially the same outer diameter as one another, the gas supply portion 13 has such a size that the inner wall surface thereof is opposed to the outer edges of the semiconductor wafers W1 and W2, and the substantially annular gas supply portion 13 is interposed between the outer edge portions of the holders 11 and 12 in the process of bonding the semiconductor wafers W1 and W2.

The outer edge portion of the semiconductor wafer W2 hits the semiconductor wafer W1 vigorously when being finally bonded to the semiconductor wafer W1. At this time, if the gas supply portion 13 is not provided, gas between the semiconductor wafers W1 and W2 makes an abrupt transition from a high-pressure state to a low-pressure state and makes adiabatic expansion, as described above. When moisture contained in the gas is condensed because of this adiabatic expansion of the gas, voids may be generated between the semiconductor wafers W1 and W2.

Meanwhile, according to the present embodiment, the gas supply portion 13 supplies gas to between the semiconductor wafers W1 and W2 when the outer edge portion of the semiconductor wafer W2 is separated from the openings OP8 and is finally bonded to the semiconductor wafer W1. Accordingly, the speed at which the semiconductor wafers W1 and W2 are bonded to each other is reduced in a region of the openings OP8. That is, the speed of bonding between the semiconductor wafers W1 and W2 is moderated, and the pressure difference between the semiconductor wafers W1 and W2 becomes small. Accordingly, adiabatic expansion is prevented, so that condensation of moisture contained in the gas is prevented. As a result, it is possible to prevent generation of voids between the semiconductor wafers W1 and W2.

A method of bonding the semiconductor wafers W1 and W2 to each other is explained below in more detail.

FIGS. 3A to 3F are cross-sectional views illustrating an example of a method of bonding the semiconductor wafers W1 and W2 to each other. FIGS. 4A to 4D are plan views illustrating the holder 12 and the semiconductor wafer W2 in a bonding process. FIGS. 5A and 5B are cross-sectional views illustrating end portions of the holders 11 and 12, and the gas supply portion 13 when the semiconductor wafers W1 and W2 are bonded to each other. FIG. 5A corresponds to FIGS. 3A to 3D, and FIG. 5B corresponds to FIG. 3F.

Figure 3A:
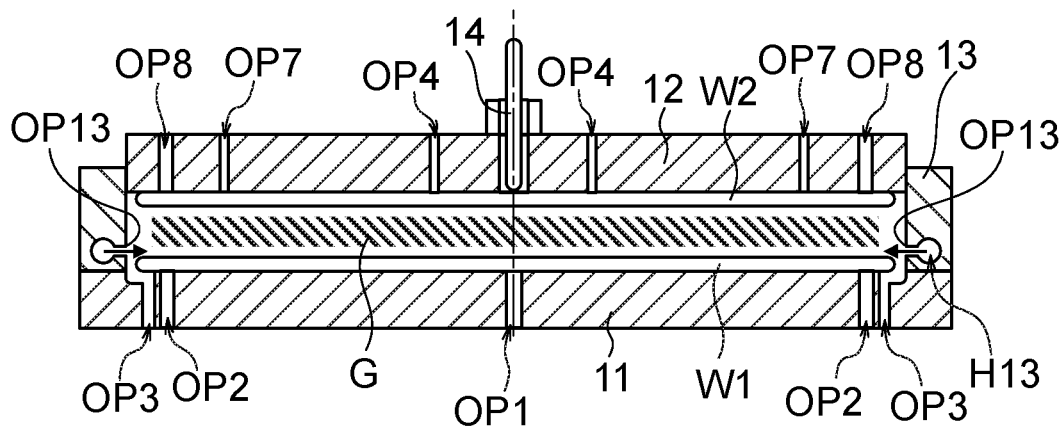
FIGS. 3A to 3F are cross-sectional views illustrating an example of a method of bonding the semiconductor wafers to each other.
Figure 4A:
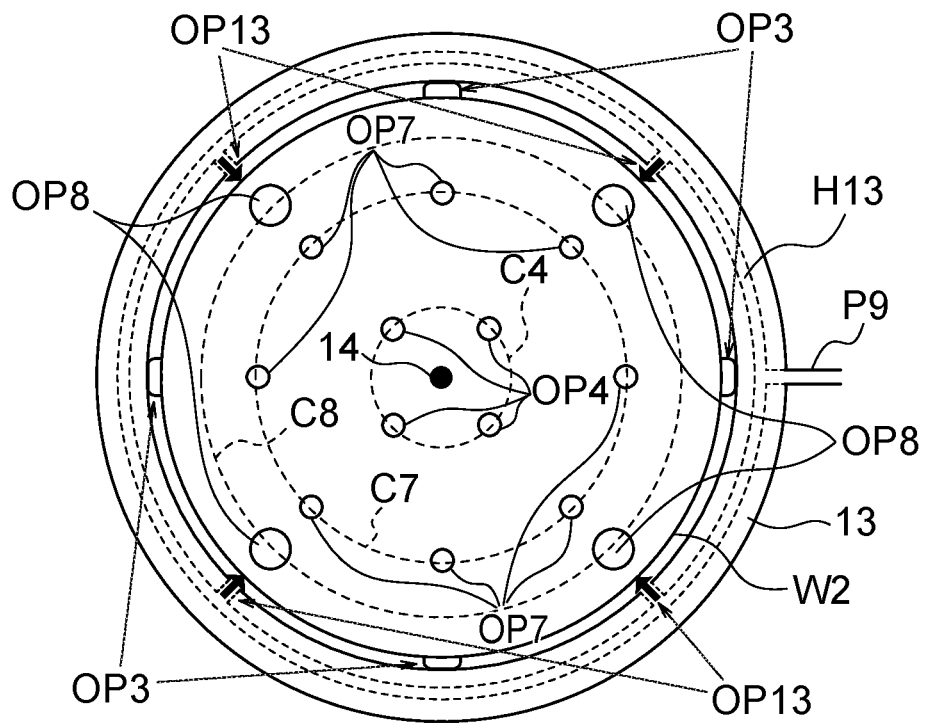
FIGS. 4A to 4D are plan views illustrating the holder and the semiconductor wafer in a bonding process.

First, as illustrated in FIG. 3A, the semiconductor wafer W1 is placed on the holder 11 and is sucked by vacuum suction. The holder 11 sucks the semiconductor wafer W1 to hold the semiconductor wafer W1 on the mounting surface thereof. The holder 11 has the openings OP1 to OP3 in the mounting surface as suction portions that suck the semiconductor wafer W1. The openings OP1 to OP3 communicate with the pipes P1 to P3 in FIG. 1, respectively, and are concentrically arranged on concentric circles about the center of the semiconductor wafer W1 and the center of the mounting surface of the holder 11 substantially evenly (see FIG. 4A). The opening OP1 is a suction portion arranged to be closer to the center than the other openings OP2 and OP3. In the present embodiment, a single opening OP1 is provided substantially at the center of the holder 11. The openings OP2 are farther from the center than the opening OP1 and arranged on the inner side than the openings OP3. The openings OP3 are farthest suction portions that are farther from the center than the other openings OP1 and OP2, suck the outer edge portion of the semiconductor wafer W1, and also have a function of exhausting gas G between the holder 11 and the holder 12. The gas G supplied into a chamber is exhausted from the outer edge of the semiconductor wafer W1 through the openings OP3 by an exhaust mechanism, for example, the vacuum pump PMP2.

While the openings OP1 to OP3 and the gas supply ports OP13 are illustrated in the same cross section in FIGS. 3A to 3F, these elements may not be arranged in the same cross section. For example, the openings OP3 may be arranged on a corresponding one of the concentric circles about the center of the holder 11 to be as far as possible from the gas supply ports OP13. By this arrangement, the position at which the gas G is supplied and the position at which the gas G is exhausted are apart from each other, so that the gas G can spread evenly in the chamber and can also flow smoothly. In a case where the gas G has a specific gravity less than air, as with helium, it is preferable that the openings OP3 as exhaust ports are provided on a side of the holder 11 below the chamber in order to fill the chamber with the gas G.

The positions and the sizes of the openings OP1 to OP3 on the holder 11 side are not specifically limited, as long as the openings OP1 to OP3 can suck the semiconductor wafer W1 and can exhaust the gas G in the chamber.

In the present embodiment, the semiconductor wafer W2 is brought closer to the semiconductor wafer W1 and is bonded thereto while the semiconductor wafer W1 is maintained in a state where it is held on the holder 11. Therefore, the gas supply ports OP13 of the gas supply portion 13 are provided at a substantially equal height to the surface (a bonding surface) of the semiconductor wafer W1 (see FIGS. 5A and 5B). To the contrary, in a case where the semiconductor wafer W1 is brought closer to the semiconductor wafer W2 and is bonded thereto, it suffices that the gas supply ports OP13 are provided at a substantially equal height to the surface (a bonding surface) of the semiconductor wafer W2.

When the semiconductor wafers W1 and W2 are bonded to each other, the gate valves V1 to V3 on the holder 11 side in FIG. 1 are open, and the vacuum pumps PMP1 and PMP2 suck the semiconductor wafer W1 onto the holder 11 by vacuum suction through the pipes P1 to P3.

Meanwhile, the holder 12 sucks the semiconductor wafer W2 and opposes the semiconductor wafer W2 to the semiconductor wafer W1 held on the holder 11. The outer diameter of the holder 12 is substantially equal to the inner diameter of the gas supply portion 13, and the holder 12 can be received inside the gas supply portion 13. Accordingly, the holders 11 and 12 and the gas supply portion 13 substantially seal the semiconductor wafers W1 and W2 between the holders 11 and 12. As illustrated in FIG. 5A, the gas supply portion 13 supplies the gas G from the gas supply ports OP13 to between the holders 11 and 12. Meanwhile, an exhaust mechanism exhausts the gas G from between the holders 11 and 12 through the openings OP3 in the holder 11. Therefore, a space between the holders 11 and 12 is maintained at a predetermined air pressure.

At this time, the gate valves V5, V7, and V8 on the holder 12 side in FIG. 1 are open, and the vacuum pump PMP1 sucks the semiconductor wafer W2 onto the holder 12 by vacuum suction through the pipes P4, P5, P7, and P8. The gate valve V10 of the gas supply portion 13 is also open and supplies the gas G from the gas supply source SRC1 to the gas supply portion 13. The gas G is inert gas, for example, helium, nitrogen, or argon.

The holder 12 sucks the entire back surface of the semiconductor wafer W2. As illustrated in FIG. 4A, the openings OP4, OP7, and OP8 are respectively arranged on concentric circles C4, C7, and C8 about the center of the holder 12 and the semiconductor wafer W2 substantially evenly. The openings OP4 are closest to the center of the holder 12, and the openings OP7 and the openings OP8 become more distant from the center in this order. The openings OP8 are arranged at outermost positions. At this time, the air pressure in the chamber may be an ordinary pressure, a reduced pressure, or a vacuum. However, it is preferable that the air pressure in the chamber is an ordinary pressure or a reduced pressure in order to improve throughput of the bonding process.

Figure 3B:
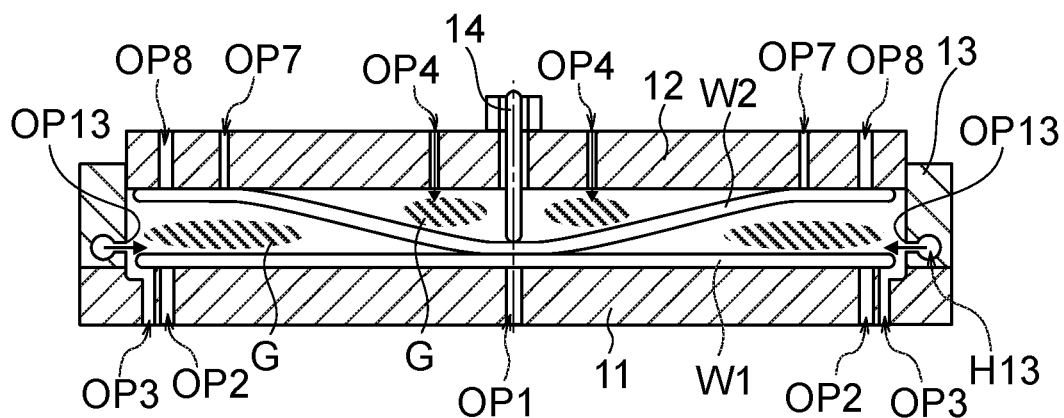

Next, the gate valve V5 in FIG. 1 is closed, and the gate valve V6 is open. Accordingly, evacuation through the openings OP4 is stopped, and the gas G from the gas supply source SRC2 is supplied to between the holder 12 and the semiconductor wafer W2. At the same time, the pushing portion 14 pushes out the back surface of the semiconductor wafer W2 toward the semiconductor wafer W1 from the center of the holder 12, as illustrated in FIG. 3B. Accordingly, the center of the semiconductor wafer W2 can easily come closer to the semiconductor wafer W1 and can easily come into contact with the semiconductor wafer W1. The gas G of the gas supply source SRC2 may be the same type of gas as the gas G of the gas supply source SRC1, and is inert gas, for example, helium, nitrogen, or argon.

Figure 4B:
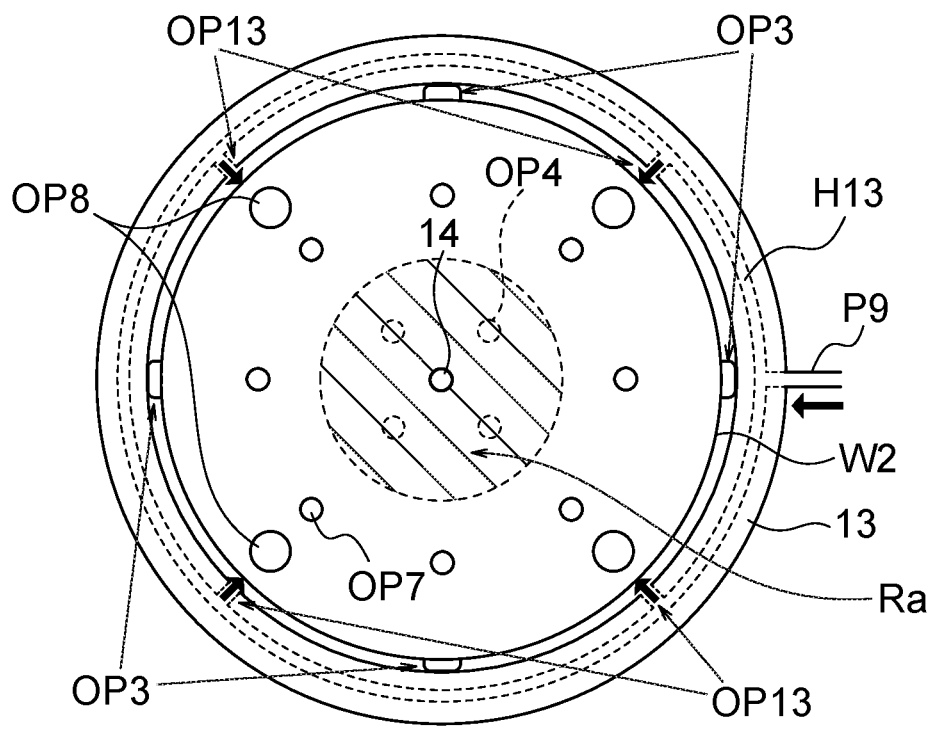
Figure 5A:
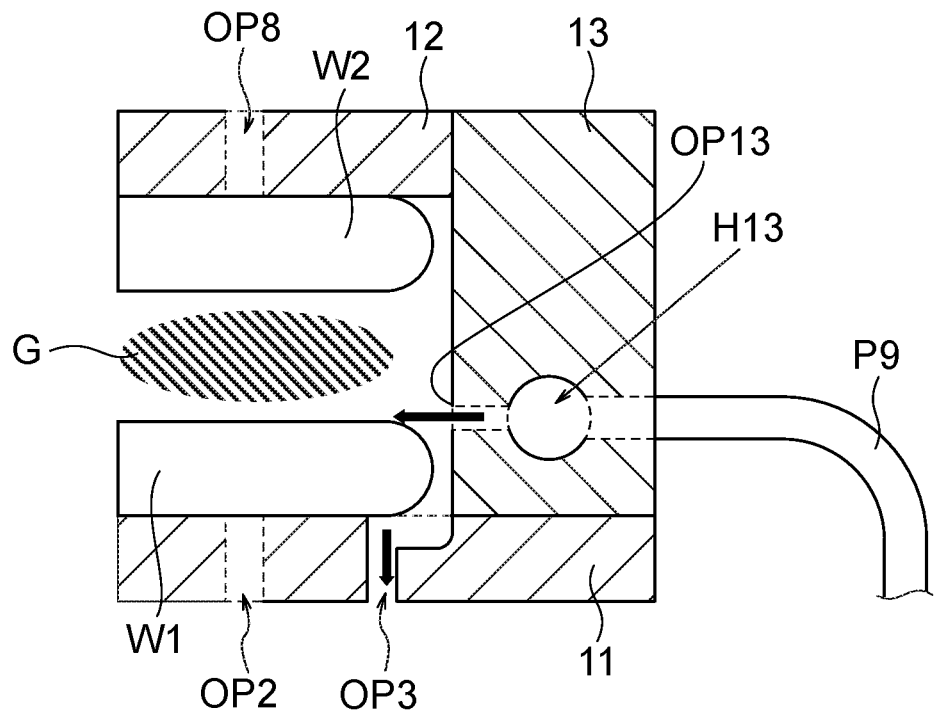
FIGS. 5A and 5B are cross-sectional views illustrating end portions of the holders, and the gas supply portion when the semiconductor wafers are bonded to each other.
Figure 5B:
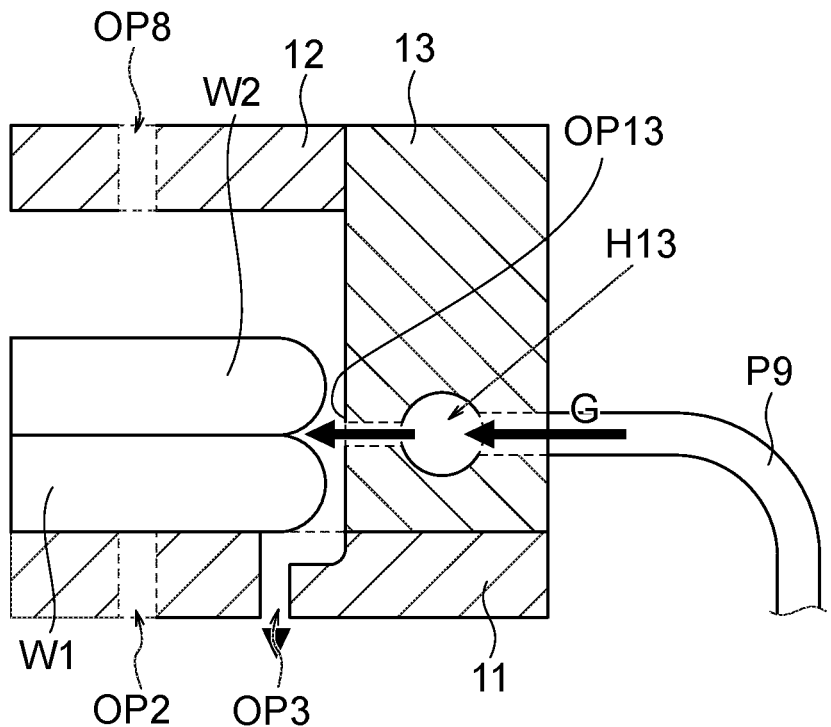

At this time, at the center of the holder 12, the back surface of the semiconductor wafer W2 is separated from the holder 12 and the semiconductor wafer W2 comes into contact with the semiconductor wafer W1, as illustrated in a bonding region Ra in FIG. 4B. The bonding region Ra is a region where the semiconductor wafer W2 is separated from the holder 12 and is in contact with the semiconductor wafer W1. The openings OP7 and OP8 still suck the back surface of the semiconductor wafer W2. Therefore, only the center of the semiconductor wafer W2 is in contact with the semiconductor wafer W1, and the outer portion of the semiconductor wafer W2 is sucked onto the holder 12.

Figure 3C:
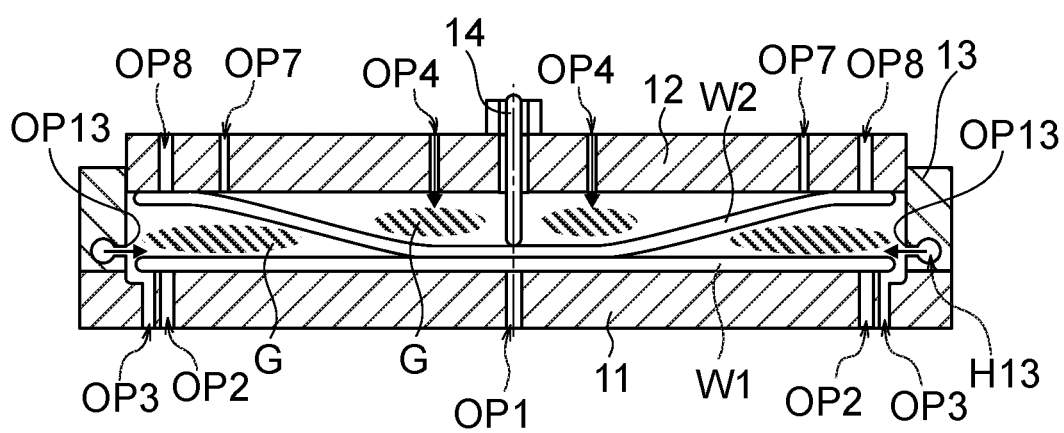
Figure 3D:
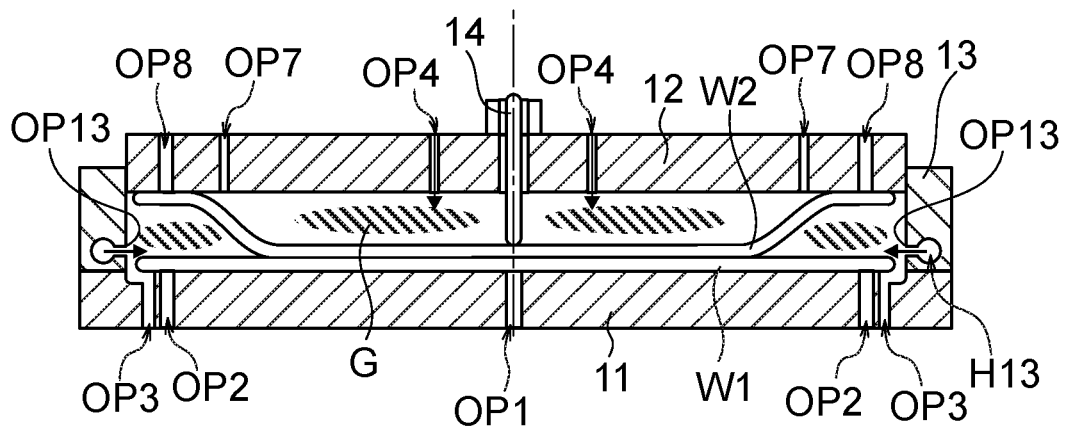

Next, the gate valve V7 in FIG. 1 is closed. Accordingly, evacuation through the openings OP7 is stopped. The gas G from the gas supply source SRC2 continues to be supplied to between the holder 12 and the semiconductor wafer W2 through the openings OP4. Therefore, bonding of the semiconductor wafers W1 and W2 easily spreads from the centers thereof to the outer edge portions thereof, as illustrated in FIGS. 3C and 3D.

Figure 4C:
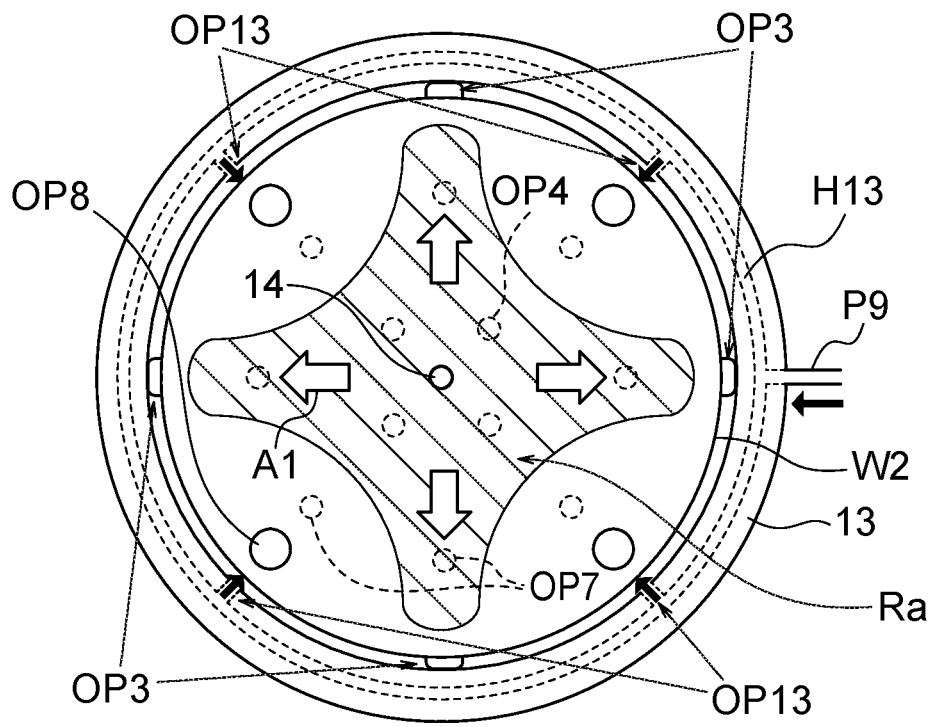

At this time, the openings OP8 suck the semiconductor wafer W2. Therefore, the back surface of the semiconductor wafer W2 is still sucked onto the holder 12 around the openings OP8 as illustrated in FIG. 4C. However, in a region away from the openings OP8 by a predetermined distance or more, the back surface of the semiconductor wafer W2 is separated from the holder 12 and the semiconductor wafer W2 is bonded to the semiconductor wafer W1. Therefore, the bonding region Ra does not spread much toward the openings OP8, but spreads in a direction of an arrow A1 toward between the adjacent openings OP8.

Figure 3E:
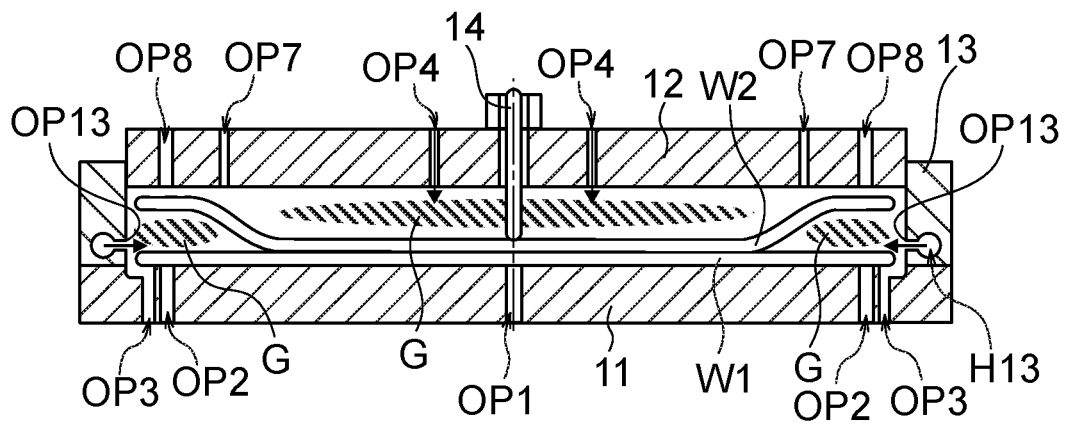

Next, the gate valve V8 in FIG. 1 is closed. Accordingly, evacuation through the openings OP8 is stopped. The outer edge portion of the semiconductor wafer W2 is also separated from the holder 12 and comes closer to the semiconductor wafer W1, as illustrated in FIG. 3E. As described above, also when the outer edge portion of the semiconductor wafer W2 is bonded to the semiconductor wafer W1, the gas supply portion 13 supplies the gas G toward a bonding position between the semiconductor wafers W1 and W2.

The gas supply ports OP13 are provided at positions corresponding to the openings OP8 as illustrated in FIG. 5B, and spray the gas G to the outer circumference of the semiconductor wafer W2 at these positions. The openings OP8 are outermost openings among the openings OP4, OP7, and OP8 in the holder 12 and suck the semiconductor wafer W2 to the end. When the semiconductor wafer W2 is separated from these openings OP8, the gas supply portion 13 supplies gas in an opposite direction to a direction in which bonding of the semiconductor wafers W1 and W2 spreads. Accordingly, the speed of final bonding between the semiconductor wafers W1 and W2 is moderated, and the pressure difference between the semiconductor wafers W1 and W2 is moderated. The gas supply portion 13 may cause to slowly and gradually bond the semiconductor wafers W1 and W2 to each other, after temporarily making the speed of bonding of the semiconductor wafers W1 and W2 zero. Accordingly, adiabatic expansion is prevented, so that condensation of moisture contained in the gas is prevented. As a result, it is possible to prevent generation of voids between the semiconductor wafers W1 and W2.

Although the amount of gas supplied from the gas supply ports OP13 may be constant from the start of bonding of the semiconductor wafers W1 and W2 to the end, it may be changed. For example, the amount of gas supplied from the gas supply ports OP13 may be set to a first flow rate that is relatively low in the steps in FIGS. 3A to 3D, and thereafter may be temporarily set to a second flow rate higher than the first flow rate when the outer edge portion of the semiconductor wafer W2 is bonded to the semiconductor wafer W1 (see FIGS. 5A and 5B). Accordingly, it is possible to effectively bond the semiconductor wafers W1 and W2 to each other slowly and to prevent adiabatic expansion, while adjusting the flow rate of gas from the gas supply portion 13.

Figure 3F:
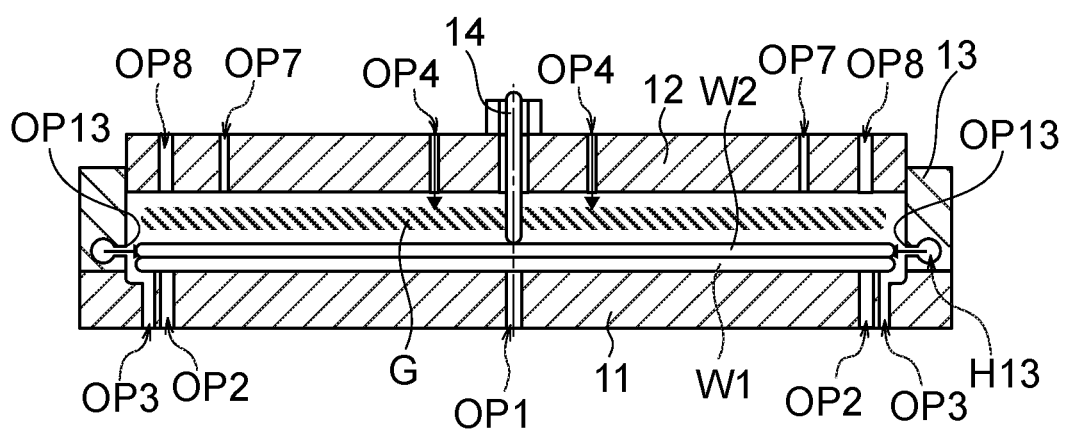
Figure 4D:
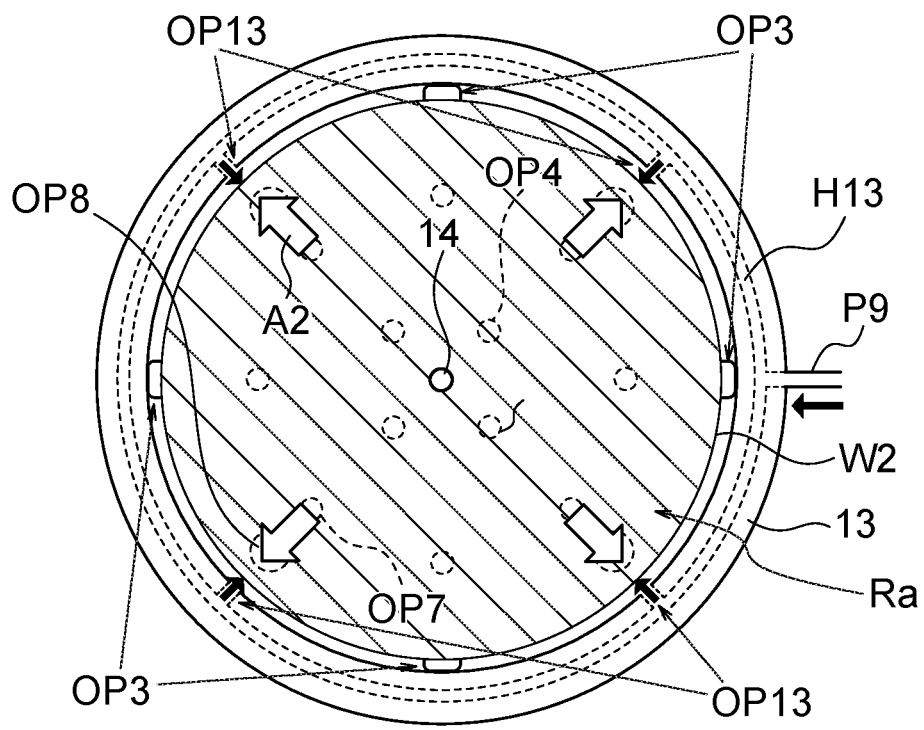

As illustrated in FIG. 4D, the back surface of the semiconductor wafer W2 is separated from the openings OP8, and the bonding region Ra spreads in a direction of an arrow A2 toward the openings OP8. The entire surface of the semiconductor wafer W2 is thus bonded to the semiconductor wafer W1, so that the bonding region Ra spreads along the entire surface of the semiconductor wafer W2. Accordingly, the semiconductor wafers W1 and W2 are bonded to each other, as illustrated in FIG. 3F.

Thereafter, the semiconductor wafers W1 and W2 that have been bonded together can be processed as an integrated substrate.

Figure 6:
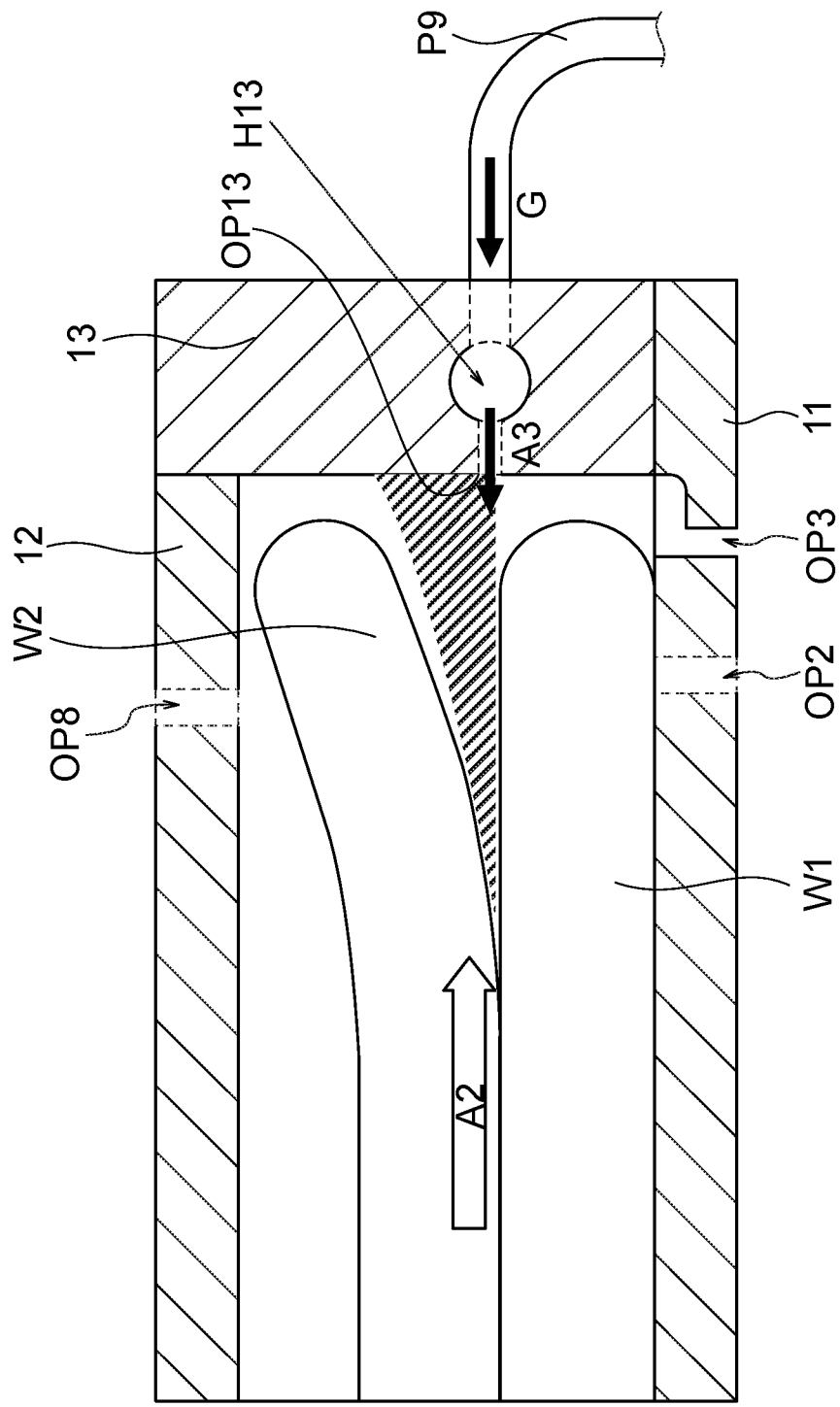
FIG. 6 is a cross-sectional view illustrating the semiconductor wafers immediately before being bonded together according to the present embodiment.

FIG. 6 is a cross-sectional view illustrating the semiconductor wafers W1 and W2 immediately before being bonded together according to the present embodiment. When the semiconductor wafer W2 is finally separated from the openings OP8, the gas supply ports OP13 supply gas in an opposite direction A3 to the spreading direction A2 in which bonding of the semiconductor wafers W1 and W2 spreads. Accordingly, in a region of the openings OP8 where the semiconductor wafers W1 and W2 are finally bonded to each other, the speed at which the semiconductor wafer W2 approaches the semiconductor wafer W1 (bonding speed) is moderated, and the pressure difference between the semiconductor wafers W1 and W2 is moderated. Accordingly, adiabatic expansion is prevented, so that condensation of moisture contained in the gas is prevented. As a result, it is possible to prevent generation of voids between the semiconductor wafers W1 and W2.

Figure 7A:
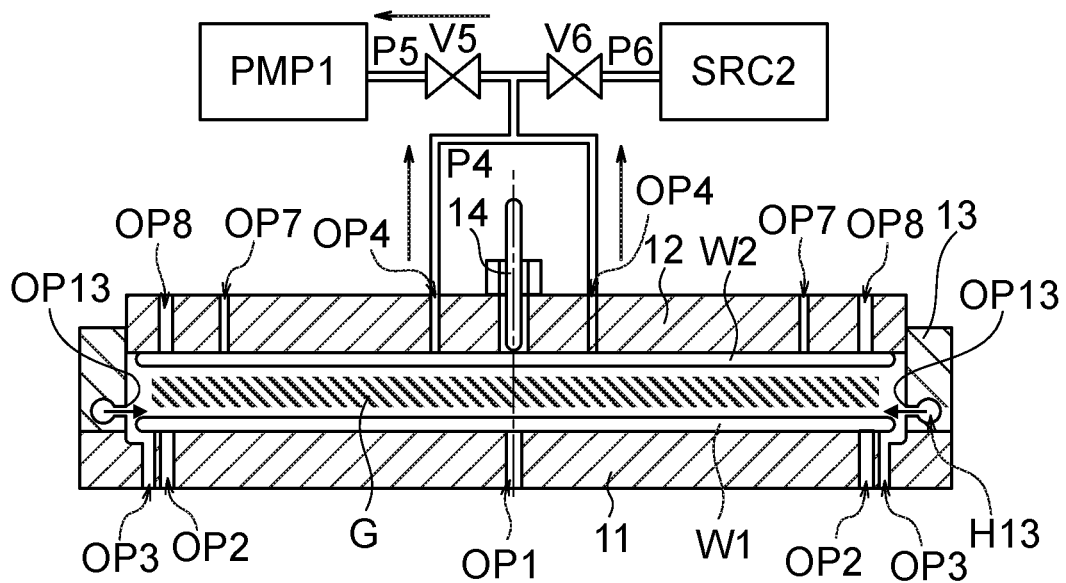
Figure 7B:
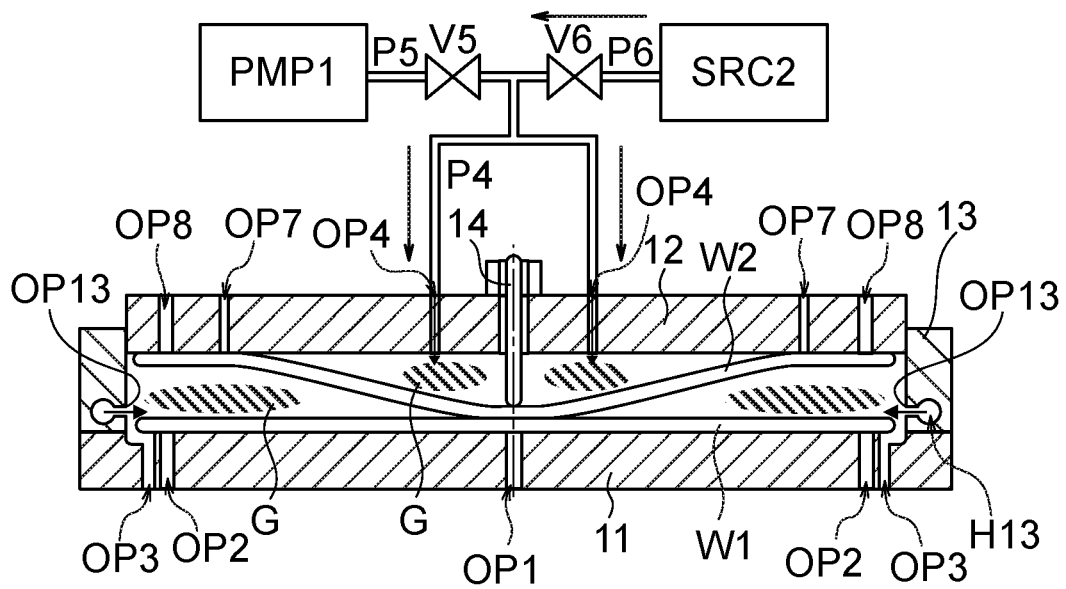

FIGS. 7A and 7B are cross-sectional views illustrating an example of configurations and functions of the pipes P4 to P6 and the like. As described above, the pipe P4 is connected to the pipes P5 and P6 in common, and sucks gas or supplies gas through the openings OP4. The openings OP4 are connected to the vacuum pump PMP1 through the pipes P4 and P5 to suck gas between the holder 12 and the semiconductor wafer W2, and are connected to the gas supply source SRC2 that supplies gas to between the holder 12 and the semiconductor wafer W2, through the pipes P4 and P6.

That is, when the holder 12 sucks the entire back surface of the semiconductor wafer W2, the gate valve V5 is open and the gate valve V6 is closed, as illustrated in FIG. 7A. Accordingly, the pipe P4 is connected to the pipe P5 and is disconnected from the pipe P6. The vacuum pump PMP1 then sucks gas between the holder 12 and the semiconductor wafer W2 through the openings OP4 via the pipes P4 and P5. Meanwhile, when the semiconductor wafer W2 is separated from the holder 12 and is bonded to the semiconductor wafer W1, the gate valve V6 is open and the gate valve V5 is closed, as illustrated in FIG. 7B. Accordingly, the pipe P4 is connected to the pipe P6 and is disconnected from the pipe P5. The gas supply source SRC2 supplies gas to between the holder 12 and the semiconductor wafer W2 through the openings OP4 via the pipes P4 and P6.

The openings OP4 are used both when the semiconductor wafer W2 is sucked and when the semiconductor wafer W2 is separated in this manner. Accordingly, it is possible to perform reliable suction of the semiconductor wafer W2 and smooth separation of the semiconductor wafer W2 with a reduced number of openings provided in the holder 12 and a reduced number of pipes.

In a case where the pipe P6 and the gas supply source SRC2 are not provided and the openings OP4 do not supply gas, outside air enters into a chamber space between the holders 11 and 12 from surroundings of the pushing portion 14 when the pushing portion 14 pushes out the semiconductor wafer W2 as illustrated in FIG. 7B. Thereafter, the outside air passes around the end portion of the semiconductor wafer W2 and enters to between the semiconductor wafers W1 and W2. This outside air may contain a lot of moisture and cause condensation and generation of voids at a bonding surface between the semiconductor wafers W1 and W2.

Meanwhile, according to the present embodiment, the openings OP4 perform both suction and supply of the gas G. Accordingly, when the pushing portion 14 pushes out the semiconductor wafer W2 as illustrated in FIG. 7B, the openings OP4 can introduce gas from the gas supply source SRC2 to between the holder 12 and the semiconductor wafer W2 and can prevent entrance of outside air. As a result, it is possible to prevent condensation and generation of voids at the bonding surface between the semiconductor wafers W1 and W2.

(First Modification)

Figure 8:
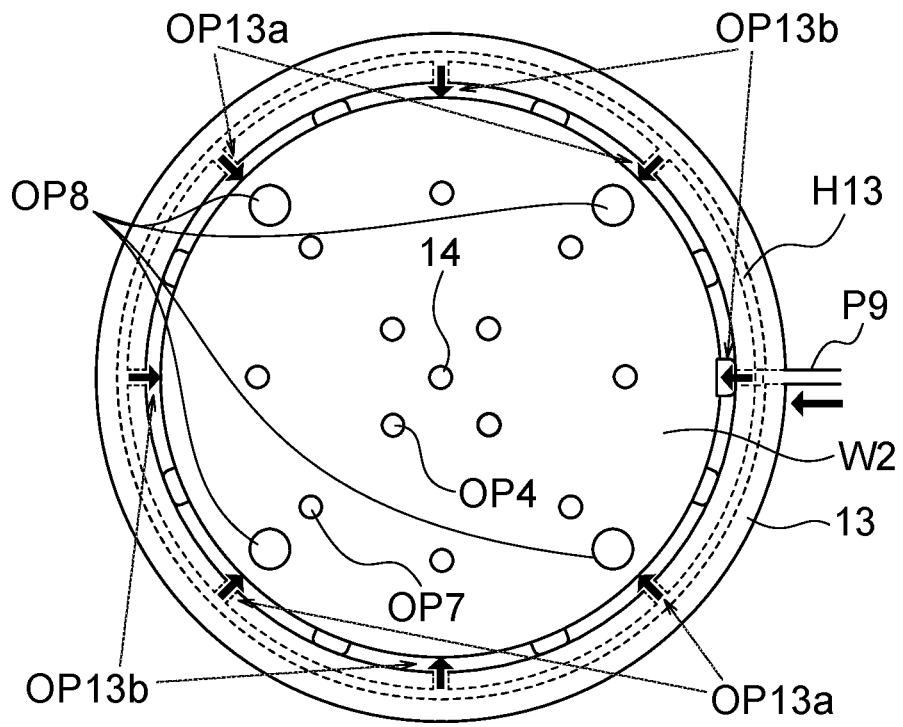
FIG. 8 is a plan view illustrating a configuration example of a bonding apparatus according to a first modification of the first embodiment.

FIG. 8 is a plan view illustrating a configuration example of a bonding apparatus according to a first modification of the first embodiment. In the above first embodiment, the gas supply ports OP13 of the gas supply portion 13 are provided to correspond to the openings OP8 that are the outermost openings farthest from the center of the holder 12, and the number of the gas supply ports OP13 is the same as the number of the openings OP8. Meanwhile, according to the first modification, the gas supply ports OP13 include gas supply ports OP13a provided to correspond to the openings OP8 and gas supply ports OP13b provided to correspond to regions between two openings OP8 that are adjacent to each other. The gas supply portion 13 may include more gas supply ports OP13 than the openings OP8 in this manner.

In order to spray gas to a bonding surface between the semiconductor wafers W1 and W2 substantially evenly, it is preferable that the gas supply ports OP13a and OP13b are concentrically arranged on a circle about the center of the holder 12 substantially evenly.

Other configurations and operations of the first modification may be identical to corresponding configurations and operations in the first embodiment. Accordingly, the first modification can obtain effects identical to those in the first embodiment. Also when the bonding region Ra spreads in the direction of the arrow A1 toward between the adjacent openings OP8 as illustrated in FIG. 4C, the pressure difference between outer edge portions of the semiconductor wafers W1 and W2 is moderated because of supply of gas at positions of the gas supply ports OP13b, so that condensation and generation of voids at a bonding surface between the semiconductor wafers W1 and W2 in this direction can be also prevented surely.

(Second Modification)

Figure 9:
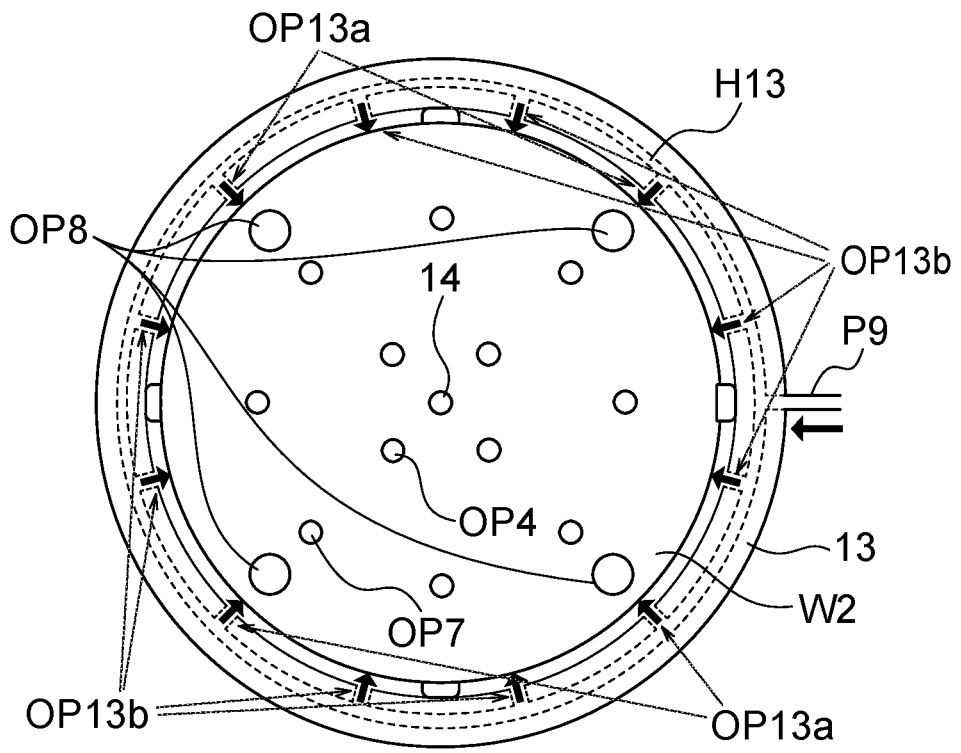
FIG. 9 is a plan view illustrating a configuration example of a bonding apparatus according to a second modification of the first embodiment.

FIG. 9 is a plan view illustrating a configuration example of a bonding apparatus according to a second modification of the first embodiment. In the second modification, the gas supply ports OP13 include the gas supply ports OP13b corresponding to regions between two openings OP8 that are adjacent to each other. Therefore, the gas supply portion 13 includes more gas supply ports OP13 than the openings OP8 as in the first modification, and includes more gas supply ports OP13 than the gas supply ports OP13 in the first modification in which one gas supply port OP13b is included between the adjacent gas supply ports OP13a. In the second modification, two gas supply ports OP13b are provided between the adjacent gas supply ports OP13a. However, the number of the gas supply ports OP13b provided between the adjacent gas supply ports OP13a is not limited thereto and may be three or more. In order to spray gas to a bonding surface between the semiconductor wafers W1 and W2 substantially evenly, it is preferable that the gas supply ports OP13a and OP13b are concentrically arranged on a circle about the center of the holder 12 substantially evenly, as described above.

Other configurations and operations of the second modification may be identical to the configurations and operations in the first modification. Accordingly, the second modification can obtain effects identical to those in the first embodiment.

(Third Modification)

Figure 10:
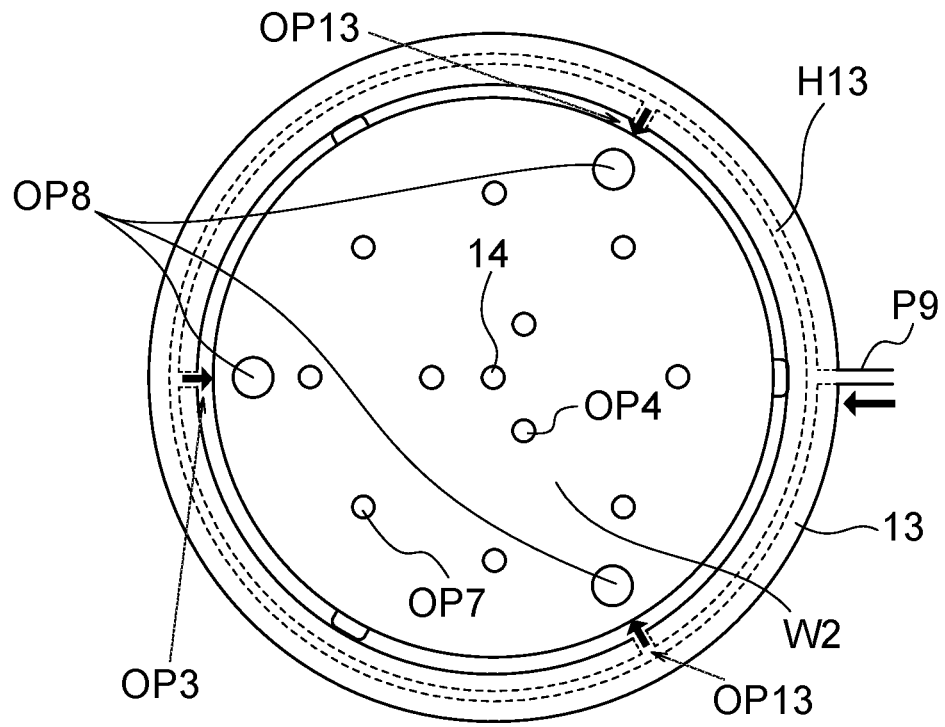
FIG. 10 is a plan view illustrating a configuration example of a bonding apparatus according to a third modification of the first embodiment.

FIG. 10 is a plan view illustrating a configuration example of a bonding apparatus according to a third modification of the first embodiment. In the third modification, the number of the openings OP8 is smaller than the number of the openings OP8 in the first embodiment. In association with this reduction, the number of the gas supply ports OP13 corresponding to the openings OP8 is also smaller than the number of the gas supply ports OP13 in the first embodiment. For example, the number of the openings OP8 and the number of the gas supply ports OP13 are each three. In order to spray gas to a bonding surface between the semiconductor wafers W1 and W2 substantially evenly, it is preferable that the gas supply ports OP13 are concentrically arranged on a circle about the center of the holder 12 substantially evenly, as described above. The number of the openings OP8 and the number of the gas supply ports OP13 are not specifically limited, and may be five or more.

As described above, even when the number of the openings OP8 that suck the semiconductor wafer W2 to the end is changed, it suffices that the gas supply ports OP13 are provided to correspond to the openings OP8. Other configurations and operations of the third modification may be identical to the configurations and operations in the first embodiment. Accordingly, the third modification can obtain effects identical to those in the first embodiment.

(Fourth Modification)

Figure 11:
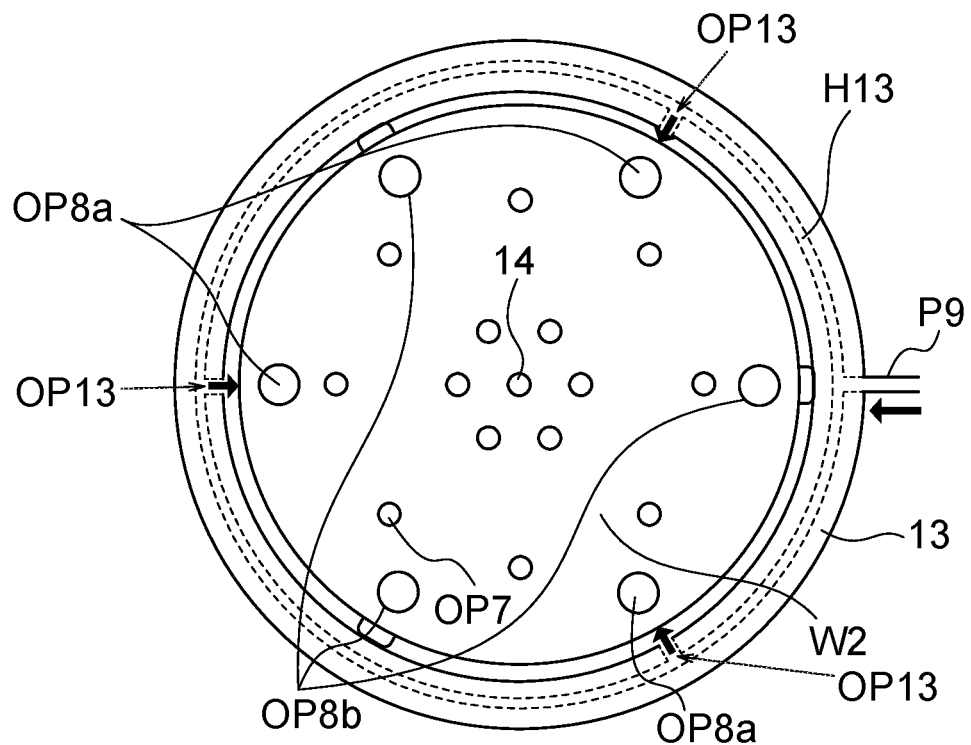
FIG. 11 is a plan view illustrating a configuration example of a bonding apparatus according to a fourth modification of the first embodiment.

FIG. 11 is a plan view illustrating a configuration example of a bonding apparatus according to a fourth modification of the first embodiment. The openings OP8 that are farthest from the center of the holder 12 include openings OP8a and OP8b. The openings OP8a and OP8b are concentrically arranged on a circle about the center of the holder 12 substantially evenly. However, the openings OP8a stop evacuation after the openings OP8b. Therefore, the openings OP8a and OP8b stop suction at different timings from each other, although they are arranged on the same circle.

Because the openings OP8a are openings that suck the semiconductor wafer W2 to the end, it suffices that the gas supply ports OP13 are provided to correspond to the openings OP8a. As described above, the gas supply ports OP13 may be provided to correspond to at least a part of the outermost openings OP8a and OP8b that are farthest from the center of the holder 12 in some cases.

Second Embodiment

Figure 12:
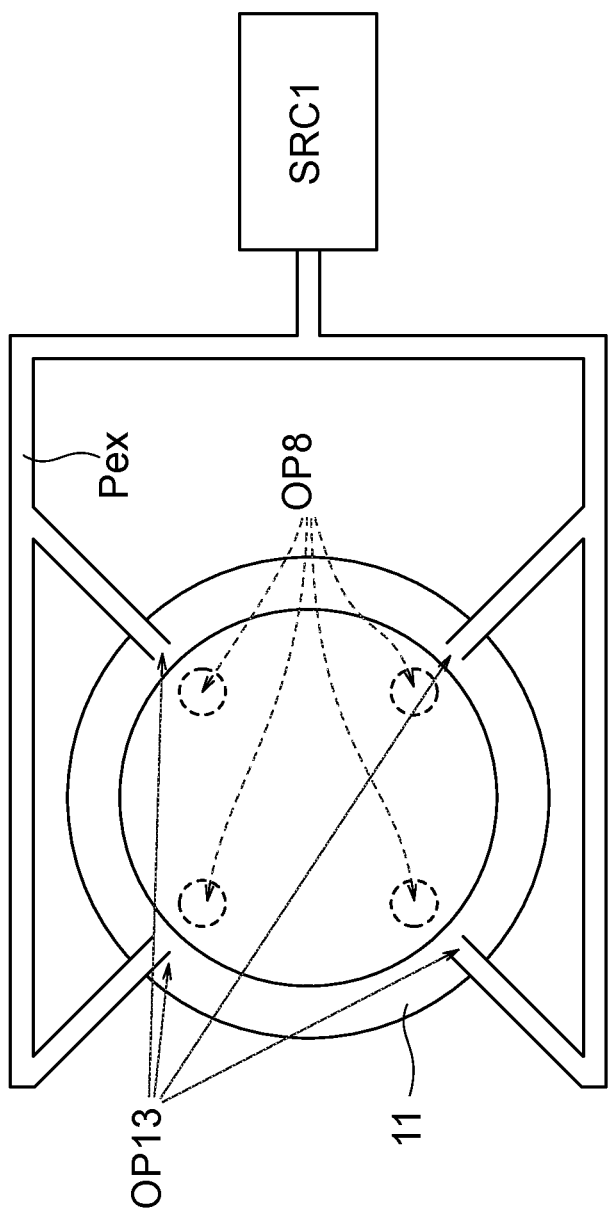
FIG. 12 is a plan view illustrating a configuration example of a bonding apparatus according to a second embodiment.

FIG. 12 is a plan view illustrating a configuration example of a bonding apparatus according to a second embodiment. In the second embodiment, the gas supply portion 13 is not provided on the holder 11, but is configured by an external pipe Pex. A main portion of the external pipe Pex is provided outside the holders 11 and 12 and supplies gas from the gas supply source SRC1 to a portion of bonding of the semiconductor wafers W1 and W2 through the gas supply ports OP13. The external pipe Pex is not provided along the outer edge of the holder 11 and therefore is not configured to be annular. Further, the gas supply portion 13 does not have the cavity H13 on the outer edge of the holder 11.

A portion of the external pipe Pex extends inward from the outside of the holders 11 and 12 toward the openings OP8 in the holder 12 beyond the outer edge of the holder 11. Accordingly, the gas supply ports OP13 in the external pipe Pex are provided to face the openings OP8, so that it is possible to spray gas to a region where the semiconductor wafers W1 and W2 are finally bonded to each other. As a result, the second embodiment can also obtain effects identical to those of the first embodiment. Further, because it is unnecessary to provide the external pipe Pex along the outer edge of the holder 11, flexibility of installation of pipes is increased.

As described above, in a case of bonding the semiconductor wafers W1 and W2 to each other in an ordinary-pressure atmosphere, the gas supply portion 13 is not required to be provided around the holders 11 and 12. That is, in this case, the bonding apparatus 1 may perform a bonding process while sidewalls of the chamber are open.

(Example of Bonding Memory Chips)

Figure 13:
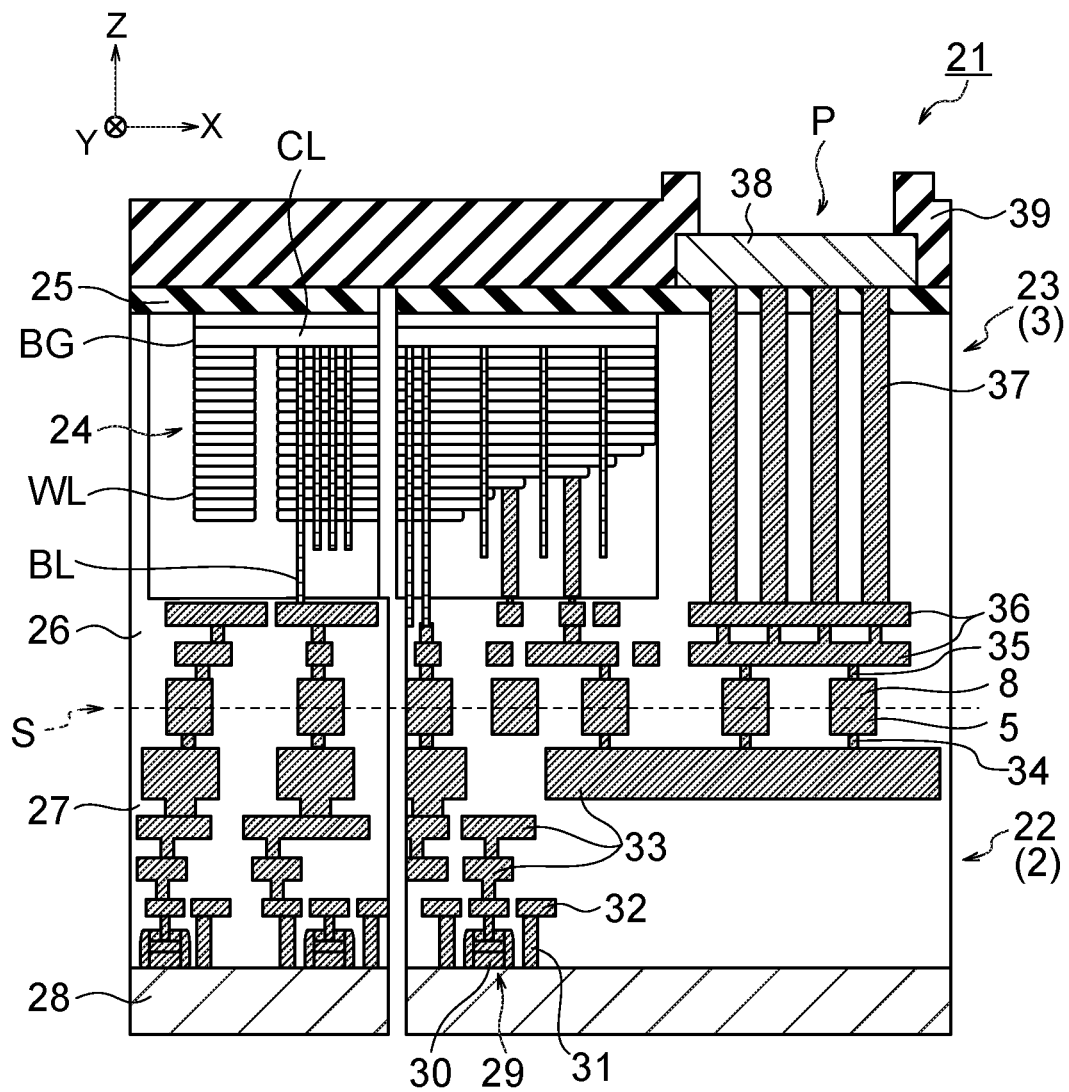
FIG. 13 is a cross-sectional view illustrating an example of a semiconductor chip fabricated by using the bonding apparatus according to any of the above embodiments.

FIG. 13 is a cross-sectional view illustrating an example of a semiconductor chip fabricated by using the bonding apparatus according to any of the above embodiments. A semiconductor chip 21 includes a control circuit chip 22 formed by a portion of a first semiconductor substrate 2 having a first circuit area and an array chip 23 formed by a portion of a second semiconductor substrate 3 having a second circuit area. The semiconductor chip 21 is fabricated by bonding a plurality of semiconductor wafers by using the bonding apparatus 1 and thereafter cutting the semiconductor wafers into individual pieces. Therefore, the control circuit chip 22 and the array chip 23 are bonded to each other.

The array chip 23 includes a memory cell array 24 including a plurality of memory cells, an insulating film 25 on the memory cell array 24, and an interlayer dielectric film 26 below the memory cell array 24. The control circuit chip 22 is provided below the array chip 23. Reference sign S denotes a surface of bonding between the array chip 23 and the control circuit chip 22. The control circuit chip 22 includes an interlayer dielectric film 27 and a substrate 28 below the interlayer dielectric film 27. The substrate 28 is a semiconductor substrate such as a silicon substrate. The insulating film 25 and the interlayer dielectric films 26 and 27 are each a silicon oxide film, a silicon nitride film, or a silicon oxynitride film, for example, and may have a structure of one material or a mixed or multilayer structure of a plurality of materials.

FIG. 13 illustrate the X-direction and the Y-direction that are parallel to a surface of the substrate 28 and are perpendicular to each other and the Z-direction perpendicular to the surface of the substrate 28. Here, the +Z-direction is described as an upward direction and the −Z-direction is described as a downward direction. For example, the memory cell array 24 that functions as the second circuit area in the array chip 23 is located above the substrate 28, and the substrate 28 is located below the memory cell array 24. It is allowable that the −Z-direction is coincident or is not coincident with the gravity direction.

The array chip 23 includes, as an electrode layer in the memory cell array 24, a plurality of word lines WL, a source line BG, a bit line BL, and selection gates (not illustrated). A columnar portion CL that penetrates through the word lines WL is electrically connected to the source line BG at one end and to the bit line BL at the other end. A memory cell is formed at an intersection between the columnar portion CL and each word line WL.

The control circuit chip 22 includes a plurality of transistors 29. Each transistor 29 includes a gate electrode 30 provided on the substrate 28 via a gate insulating film and a source diffusion layer and a drain diffusion layer (both not illustrated) that are provided in the substrate 28. The control circuit chip 22 further includes a plurality of plugs 31 provided on the source or drain diffusion layers of the transistors 29, a wiring layer 32 that is provided on these plugs 31 and includes a plurality of wires, and a wiring layer 33 that is provided on the wiring layer 32 and includes a plurality of wires. The control circuit chip 22 further includes a plurality of via plugs 34 provided on the wiring layer 33 and a plurality of metal pads 5 provided in the interlayer dielectric film 27 on the via plugs 34. The control circuit chip 22 having the first circuit area described above functions as a control circuit (a logic circuit) that controls the array chip 23.

The array chip 23 includes a plurality of metal pads 8 provided on the metal pads 5 in the interlayer dielectric film 26, a plurality of via plugs 35 provided on the metal pads 8, and a wiring layer 36 that is provided on the via plugs 35 and includes a plurality of wires. Each word line WL and each bit line BL are electrically connected to corresponding wires in the wiring layer 36. The array chip 23 further includes via plugs 37 that are provided in the interlayer dielectric film 26 or the insulating film 25 and are provided on the wiring layer 36, and a metal pad 38 provided on the insulating film 25 or the via plugs 37.

The metal pad 38 functions as an external connection pad of the semiconductor chip 21, and can be connected to a mounting board or another device via a bonding wire, a solder ball, a metal bump, or the like. The array chip 23 further includes a passivation film 39 formed on the insulating film 25 and the metal pad 38. The passivation film 39 has an opening P through which a top surface of the metal pad 38 is exposed. The opening P is used for connecting a bonding wire to the metal pad 38, for example.

The bonding apparatus 1 according to the present embodiment can be used for bonding of semiconductor wafers in such a memory device. By this bonding, the metal pad 5 and the metal pad 8 are joined to each other on the bonding surface S. Instead of the metal pads 5 and 8, wires may be joined to each other on the bonding surface S. A metal, for example, copper is used for the metal pads 5 and 8 or wires that are to be joined to each other.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A bonding apparatus comprising:
a first holder configured to hold a first semiconductor wafer;
a second holder including a plurality of suction portions that are configured to suck a second semiconductor wafer and are arranged on concentric circles about a center of the second semiconductor wafer substantially evenly, and configured to bond the second semiconductor wafer to the first semiconductor wafer while opposing the second semiconductor wafer to the first semiconductor wafer; and
a first gas supply portion having a plurality of first gas supply ports configured to supply gas toward a bonding position between the first semiconductor wafer and the second semiconductor wafer, wherein
the first gas supply ports are provided to correspond to at least a part of outermost suction portions that are farthest ones of the suction portions from a center of the second holder, and are concentrically arranged on a circle about the center of the second holder substantially evenly,
the suction portions include the outermost suction portions and inner suction portions closer to the center of the second holder than the outermost suction portions, and
when bonding the second semiconductor wafer to the first semiconductor wafer, the inner suction portions stop the suction of the second semiconductor wafer to spread bonding between the first and second semiconductor wafers from the center of the second semiconductor wafer to an outer circumference thereof in a direction toward between adjacent two of the outermost suction portions while the outermost suction portions suck the second semiconductor wafer, and the outermost suction portions stop the suction of the second semiconductor wafer to separate the second semiconductor wafer from the outermost suction portions and to spread the bonding between the first and second semiconductor wafers toward the outermost suction portions.

2. The apparatus of claim 1, wherein the outermost suction portions corresponding to the first gas supply ports are ones of the suction portions which suck the second semiconductor wafer to the end when the first and second semiconductor wafers are bonded to each other.

3. The apparatus of claim 1, wherein the first gas supply ports supply gas in an opposite direction to a spreading direction in which bonding of the first semiconductor wafer and the second semiconductor wafer spreads, when the second semiconductor wafer is separated from the outermost suction portions.

4. The apparatus of claim 1, wherein a part of the inner suction portions sucks the second semiconductor wafer when the second semiconductor wafer is opposed to the first semiconductor wafer, and supplies gas to between the second holder and the second semiconductor wafer when the second semiconductor wafer is bonded to the first semiconductor wafer.

5. The apparatus of claim 1, wherein
the first gas supply portion is a tubular member that is hollow and is provided along an outer circumference of the first holder, and
the first gas supply ports are openings communicating with an inner portion of the tubular member.

6. The apparatus of claim 5, wherein the first gas supply portion is provided to be substantially annular, and guides the second holder inside the first gas supply portion that is substantially annular when the first and second semiconductor wafers are bonded to each other.

7. The apparatus of claim 1, further comprising a gas supply source configured to introduce gas into the first gas supply portion.

8. The apparatus of claim 1, wherein the first gas supply portion further has a plurality of second gas supply ports provided on the circle to correspond to regions between the outermost suction portions that are adjacent to each other.

9. The apparatus of claim 1, further comprising a pushing portion provided at the center of the second holder and configured to push out the second semiconductor wafer toward the first semiconductor wafer from the second holder.

10. The apparatus of claim 1, wherein the first gas supply portion includes an external pipe that is provided outside the first and second holders and communicates with the first gas supply ports.

11. The apparatus of claim 10, wherein a space between the first and second holders has an ordinary-pressure atmosphere, when the first and second semiconductor wafers are bonded to each other.

12. The apparatus of claim 1, further comprising an exhaust mechanism configured to exhaust gas from a space surrounded by the first and second holders and the first gas supply portion through openings arranged in the first holder.

13. The apparatus of claim 1, wherein the suction portions include three or more outermost suction portions.

14. A bonding method using a bonding apparatus that includes a first holder configured to hold a first semiconductor wafer, a second holder configured to suck a second semiconductor wafer and to bond the second semiconductor wafer to the first semiconductor wafer while opposing the second semiconductor wafer to the first semiconductor wafer, and a first gas supply portion configured to supply gas toward a bonding position between the first semiconductor wafer and the second semiconductor wafer, the second holder comprising suction portions including outermost suction portions that are farthest ones of the suction portions from a center of the second holder and inner suction portions closer to the center of the second holder than the outermost suction portions,
the method comprising:
placing the first semiconductor wafer on the first holder;
causing the second semiconductor wafer to be sucked onto the second holder;
opposing the second semiconductor wafer to the first semiconductor wafer;
stopping suction of the second semiconductor wafer by the inner suction portions to spread bonding between the first and second semiconductor wafers from the center of the second semiconductor wafer to an outer circumference thereof in a direction toward between adjacent two of the outermost suction portions while sucking the second semiconductor wafer by the outermost suction portions, stopping suction of the second semiconductor wafer by the outermost suction potions, after stopping the suction by the inner suction portions, to separate the second semiconductor wafer from the outermost suction portions and to spread the bonding between the first and second semiconductor wafers toward the outermost suction portions, and supplying gas toward the bonding position between the first semiconductor wafer and the second semiconductor wafer substantially evenly along the outer circumference of the second semiconductor wafer, when the second semiconductor wafer is separated from the outermost suction portions and bonded to the first semiconductor wafer.

15. The method of claim 14, wherein gas is supplied in a direction opposite to a spreading direction in which bonding of the first semiconductor wafer and the second semiconductor wafer spreads, when the second substrate is separated from outermost suction portions in the second holder which suck the second semiconductor wafer to the end and a whole surface of the second semiconductor wafer opposed to the first substrate is bonded to the first semiconductor wafer.

16. The method of claim 14, wherein gas is supplied to between the second holder and the second semiconductor wafer when the second substrate is bonded to the first semiconductor wafer.

17. The method of claim 16, wherein gas supplied toward the bonding position between the first semiconductor wafer and the second semiconductor wafer and gas supplied to between the second holder and the second semiconductor wafer are a same type of gas as each other, when the first and second substrates semiconductor wafers are bonded to each other.

18. The method of claim 14, wherein a pushing portion provided at the center of the second holder pushes out the second semiconductor wafer toward the first semiconductor wafer from the second holder when the first and second semiconductor wafers are bonded to each other.

19. The method of claim 14, wherein a first metal pad and a second metal pad respectively arranged on bonding surfaces of the first and second semiconductor wafers are joined to each other, when the first and second semiconductor wafers are bonded to each other.

20. A bonding apparatus comprising:

a first holder configured to hold a first semiconductor wafer;

a second holder including a plurality of suction portions that are configured to suck a second semiconductor wafer and are arranged on concentric circles about a center of the second semiconductor wafer substantially evenly, and configured to bond the second semiconductor wafer to the first semiconductor wafer while opposing the second semiconductor wafer to the first semiconductor wafer; and a first gas supply portion having a plurality of first gas supply ports configured to supply gas toward a bonding position between the first semiconductor wafer and the second semiconductor wafer, wherein the first gas supply ports are provided to correspond to at least a part of outermost suction portions that are farthest ones of the suction portions from a center of the second holder, and are concentrically arranged on a circle about the center of the second holder substantially evenly, and the second holder has a plurality of openings, as a part of the suction portions, arranged to be closer to the center of the second holder than the outermost suction portions, the openings being connected to a pump that sucks gas between the second holder and the second semiconductor wafer and being connected to a gas supply source that supplies gas to between the second holder and the second semiconductor wafer.

* * * * *